US008378271B2

(12) United States Patent
O'Neil et al.

(10) Patent No.: US 8,378,271 B2
(45) Date of Patent: Feb. 19, 2013

(54) UTILIZATION OF OVERVOLTAGE AND OVERCURRENT COMPENSATION TO EXTEND THE USABLE OPERATING RANGE OF ELECTRONIC DEVICES

(75) Inventors: Gary E. O'Neil, Raleigh, NC (US); Michael E. Stopford, Milton, VT (US); James B. Tate, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 1479 days.

(21) Appl. No.: 11/776,340

(22) Filed: Jul. 11, 2007

(65) Prior Publication Data

US 2009/0014433 A1 Jan. 15, 2009

(51) Int. Cl.
*H05B 1/02* (2006.01)
(52) U.S. Cl. ........ 219/491; 219/209; 219/497; 219/501; 323/364
(58) Field of Classification Search .................. 219/209, 219/210, 497, 499, 501, 505; 323/366
See application file for complete search history.

(56) References Cited

U.S. PATENT DOCUMENTS

| 4,675,777 | A | 6/1987 | Watrous |
| 5,324,916 | A | 6/1994 | Goto et al. |
| 5,369,245 | A | 11/1994 | Pickering |
| 5,774,331 | A | 6/1998 | Sach |
| 5,911,897 | A | 6/1999 | Hamilton |
| 6,046,433 | A | 4/2000 | Gross et al. |
| 6,525,354 | B2 | 2/2003 | Masleid |
| 6,621,055 | B2 | 9/2003 | Weber et al. |
| 6,917,237 | B1 | 7/2005 | Tschanz et al. |
| 7,050,959 | B1 | 5/2006 | Pollard et al. |
| 8,086,358 | B2 | 12/2011 | O'Neil et al. |
| 2003/0038332 | A1 | 2/2003 | Kimura |
| 2005/0268133 | A1 | 12/2005 | Beard |
| 2009/0016408 | A1 | 1/2009 | Doan et al. |

FOREIGN PATENT DOCUMENTS

| EP | 0540287 A2 | 10/1992 |
| JP | 05-029428 | 2/1993 |
| JP | 05-226440 | 9/1993 |
| JP | 05-235254 | 9/1993 |
| JP | 07-153876 A | 6/1995 |
| JP | 07153876 A | 6/1995 |

(Continued)

OTHER PUBLICATIONS

U.S. Appl. No. 11/776369, "System for Extending the Operating Temperature Range of High Power Devices," Non-Final Office Action dated Nov. 27, 2009.

(Continued)

*Primary Examiner* — Mark Paschall
(74) *Attorney, Agent, or Firm* — Yudell Isidore Ng Russell PLLC (57) ABSTRACT

A method and system for inducing augmented levels of heat dissipation by exploiting quiescent IC leakage currents to control the temperature in high power devices. A heat control and temperature monitoring system (HCTMS) utilizes a thermal sensor to sense the junction temperature of a component, which becomes self-heated due to the quiescent leakage current inherent to the component upon the application of power to the component. By increasing the voltage level of the power source, this quiescent self-heating property is augmented, which serves to accelerate the preheating of the device, until the temperature rises above the minimum specified operating temperature of the component. The system is then reliably initialized by applying full system power and triggering a defined initialization sequence/procedure. Once the component is operational, the component's temperature is maintained above the minimum operating threshold via continued self-heating, continued augmentation of the applied DC voltage, or both, as is required.

19 Claims, 5 Drawing Sheets

FOREIGN PATENT DOCUMENTS

| | | |
|---|---|---|
| JP | 2000-101276 A | 4/2000 |
| JP | 2000101276 A | 4/2000 |
| JP | 2003-309317 A | 10/2003 |
| JP | 2003309317 A | 10/2003 |
| JP | 2004-221157 A | 8/2004 |
| JP | 2004221157 A | 8/2004 |

OTHER PUBLICATIONS

U.S. Appl. No. 11/776,369, "System for Extending the Operating Temperature Range of High Power Devices," Final Office Action dated May 26, 2010.

Zurek et al., "Elevated Temperature Performance of Pseudomorphic AlGaAs/AnGaAs MODFET's" IEEE 1998 p. 2-8.

U.S. Appl. No. 11/776,353, "Method for Pre-Heating High Power Devices to Enable Low Temperature Start-Up and Operation," Non-Final Office Action dated Jul. 16, 2009.

U.S. Appl. No. 11/776,353, "Method for Pre-Heating High Power Devices to Enable Low Temperature StartUp and Operation," Notice of Allowance dated Aug. 23, 2011.

Application No. JP2008173262, Filed: Jul. 2, 2008, Inventor: Gary E. O'Neill, et al., JPO Office Action Dated Sep. 18, 2012—Information Materials for IDS.

UTILIZATION OF OVERVOLTAGE AND OVERCURRENT COMPENSATION TO EXTEND THE USABLE OPERATING RANGE OF ELECTRONIC DEVICES

RELATED APPLICATIONS

The present application is related to the subject matter of the following co-pending applications, filed concurrently herewith and similarly assigned. The content of the related applications are incorporated herein by reference:

Ser. No. 11/776,369 and titled "System for Extending the Operating Temperature Range of High Power Devices;" and Ser. No. 11/776,353 and titled "Method for Pre-Heating High Power Devices to Enable Low Temperature Start-Up and Operation."

BACKGROUND OF THE INVENTION

1. Technical Field

The present invention generally relates to electronic devices and in particular to temperature control in electronic devices. Still more particularly, the present invention relates to leakage currents and temperature control in electronic devices.

2. Description of the Related Art

When microelectronic devices are operated within the confines of their standard operating bias conditions, reliable performance is often restricted to a limited temperature range. In addition, these devices generally become unstable at low temperatures which limit the likelihood of reliable system startup, causing improper initialization and operation of the devices. As the technology evolves towards increased complexity and faster speeds, power dissipation resulting from the increased power densities of these devices become increasingly difficult to manage. The large amount of power (heat) dissipated by these complex devices is due in part to high quiescent leakage currents that are manifest by the large quantity and reduced lengths of parallel current paths inherent in the design of these devices. Excessive power levels lead to damaging high temperatures within the device, and cooling systems are employed to prevent temperatures from reaching destructive limits.

To further mitigate the problem of excessive power dissipation, operating voltages are reduced to a minimum value consistent with acceptable performance. However, this trend towards lower/minimum operating voltages appears paradoxical since higher voltages often imply improved performance due to higher noise margins. Thus, the useful range of function and performance is being traded off against reliability lifetime by restricting the limits of temperature and operating voltages. As operating voltages continue to be reduced in order to counter increased device power dissipation from increased power densities, rapid convergence of these mitigating processes (of reducing operating voltages and increasing power densities) towards a finite limit is apparent. New designs are tasked with managing the delicate balance between reducing operating voltages and increasing power densities to achieve increased functionality and/or performance over a maximized temperature range of reliable operation. As the trend continues, the balance becomes increasingly insurmountable and the range of reliable operation becomes proportionally more restricted.

SUMMARY OF THE INVENTION

Disclosed are a method and system for inducing and controlling the heat dissipated by leakage currents inherent to integrated circuits (ICs) to enable efficient attainment of a localized/junction temperature within an operating temperature range for operation of high power devices. In particular, a heat control & temperature monitoring system (HCTMS) utilizes an attached or embedded thermal sensor to sense the junction temperature of a non-operating microprocessor or application specific integrated circuit (ASIC). Upon the application of a power source, (for start up initialization), the device becomes self-heated due to the quiescent leakage current inherent with the device. By increasing the voltage level of the power source, this quiescent self-heating property is augmented which serves to accelerate the preheating or elevation of the temperature of the device, until the temperature, as measured by a localized thermal sensor, rises above the minimum specified operating temperature of the device. The voltage level of the power source is then restored to a standard operating level. The device may then be reliably initialized by applying full system power, and triggering a hardware reset or defined initialization sequence/procedure. Once the device is operational, self-heating continues to maintain the device temperature at or above the minimum operating threshold. In extreme cases, the augmented voltage level is maintained, an ancillary heater is employed, or both mechanisms are concurrently applied to keep the device junction temperature in an operating temperature range.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method and system for inducing and controlling the heat dissipated by leakage currents inherent to integrated circuits (ICs) to enable efficient attainment of a localized/junction temperature within an operating temperature range for operation of high power devices. In particular, a heat control & temperature monitoring system (HCTMS) utilizes an attached or embedded thermal sensor to sense the junction temperature of a non-operating microprocessor or ASIC (device). Upon the application of a power source, (for start up initialization), the device becomes self-heated due to the quiescent leakage current inherent with the device. By increasing the voltage level of the power source, this quiescent self-heating property is augmented which serves to accelerate the preheating or elevation of the temperature of the device, until the temperature, as measured by a localized thermal sensor, rises above the minimum specified operating temperature of the device. The voltage level of the power source is then restored to a standard operating level. The device may then be reliably initialized by applying full system power, and triggering a hardware reset or defined initialization sequence/procedure. Once the device is operational, self-heating continues to maintain the device temperature at or above the minimum operating threshold. In extreme cases, the augmented voltage level is maintained, an ancillary heater is employed, or both mechanisms are concurrently applied to keep the device junction temperature in an operating temperature range.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

It is also understood that the use of specific parameter names are for example only and not meant to imply any limitations on the invention. The invention may thus be implemented with different nomenclature/terminology utilized to describe the above parameters, without limitation.

Figure 1:
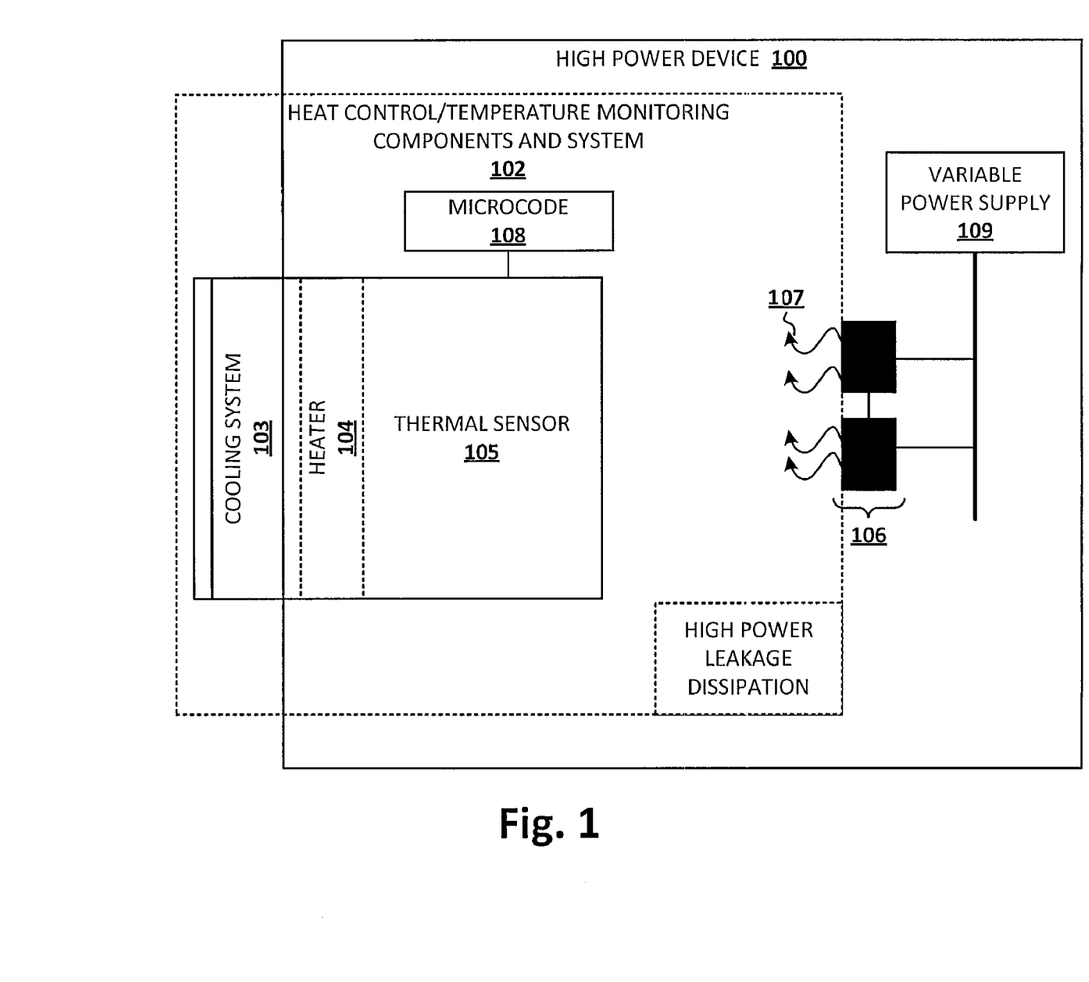
FIG. 1 depicts a high power device within which features of the invention may be advantageously implemented.

With reference now to the figures, FIG. 1 depicts a system within which features of the invention may be advantageously implemented. System 100 comprises temperature control sub-system 102. Temperature control sub-system 102 comprises the following elements: (1) Thermal sensor 105; (2) Cooling system 103; and (3) heater 104. System 100 also comprises components experiencing high levels of power dissipation (107), illustrated by high power component(s) 106. System 100 also comprises variable power supply 109. System 100 further comprises one or more devices which experience quiescent leakage current when the devices are either turned on but remain idle or are not operational. These one or more devices may comprise transistors or other integrated circuit components that exhibit the characteristics of generating heat dissipation due to leakage currents whenever power is applied to terminals of the devices, even when the device is itself still in the "off" (non-operational) mode. These devices may be sub-components of high power components 106 and/or may also be (or be a part of) separate, non-high power components within the overall system 100. High power components 106 are responsible for quiescent self heating, which (self heating) is the result of the high power dissipation (107), and which may be due in part to leakage currents in electronic devices of the high power components 106.

According to the illustrative embodiment, temperature control sub-system 102 completes a series of functional processes using the components within system 100, including: (1) monitoring a temperature and a temperature change of components 106 relative to a lowest operational temperature of components 106; (2) applying increased/maximum operating voltages to components 106 or sub-components within components 106 to induce augmented levels of quiescent leakage currents to accelerate the elevation of temperature to within an operational range; (3) analyzing temperature monitoring results to determine whether quiescent self heating at specific temperatures is sufficient to efficiently and singularly elevate an operational temperature of components 106; (4) utilizing the quiescent self heating properties of components 106 without activating an ancillary heating source to maintain an operating temperature above the low operating temperature threshold; and other features/functionality described below and illustrated by FIGS. 2-4. As further illustrated, temperature control sub-system 102 may also include microcode 108 (or operational logic), which activates the second, third and fourth functional features above, prior to and during system operation. This embodiment does not require, but also does not preclude the use of an ancillary heater (heater 104) which can be incorporated within related alternate embodiments to aid in the acceleration, attainment, or maintenance of junction temperature above a lowest operating temperature.

In temperature control sub-system 102, cooling components/system 103 is essentially coupled to thermal sensor 105. Cooling system 103 may comprise a heat sink(s) and/or a cooling fan(s), for example. Thermal sensor 105 is also operationally coupled to high power (dissipating) components 106 of device 100. In one embodiment, thermal sensor 105 is an embedded thermal diode which measures the temperature of specific components (among high power components 106) with reference to a low operational temperature threshold. The temperature detected by the thermal diode, i.e., the junction temperature, is determined by measuring a forward bias voltage of the diode which varies linearly with temperature.

Thermal sensor 105 functions as a reliable thermal monitor prior to, during and after system startup, since thermal sensor 105 is capable of accurately reflecting the stabilized (average) system ambient temperature prior to the application of system power. In addition, thermal sensor 105 provides a strategic monitor of maximum system operating temperature by virtue of its proximity to the high power dissipation devices (for example, high power components 106) within a system. While the illustrative embodiment is described with a thermal diode providing the functionality of the device's thermal monitor/sensor, many other types of devices may be utilized to provide the temperature monitoring function described herein, including thermistors (temperature sensitive resistors), bimetallic thermocouples or thermostats, et al., and the specific use/description of a thermal diode is simply for illustration and not intended to be limiting on the invention.

Heater 104 is placed substantially adjacent to thermal sensor 105, as illustrated in device 100. Heater 104 is only utilized as a back-up heating source to the self heating process in the initialization (start up) procedure when the temperature of high power component 106 within system 100 is below the lowest operational temperature of the component. Thus, heat generated by/from heater 104 may be occasionally combined with the heat generated by the device's quiescent self heating process to preheat system 100 (and specifically high power components 106) up to a lowest operational temperature (of the components and/or system) in order to accelerate the system start up process.

Before system 100 becomes operational, the temperature of components 106 is raised to an operational temperature level. The self heating process resulting from leakage currents inherent to ICs is exploited in order to raise the temperature to an operational level of the components 106. In order to achieve a greater degree of self heating compared to the degree of self heating attained with an applied standard operating voltage, variable power supply 109 is increased up to a limit specified as the maximum safe operating voltage for components 106. Increasing operating voltages to components 106 or sub-components within components 106 induces augmented levels of quiescent leakage currents which accelerates the elevation of junction temperatures to within an operational range. Once components 106 attain operational temperature levels, system power is applied and an initialization procedure commences, which concludes when the device becomes operational. When the device becomes operational, the self heating process continues and may be singularly used to maintain the device temperature above the lowest operational temperature.

The actual locations/positions of the above described components may vary relative to each other, and the illustrative embodiment is provided solely to illustrate one possible implementation and is not intended to limit the invention to the illustrated configuration.

Figure 2:
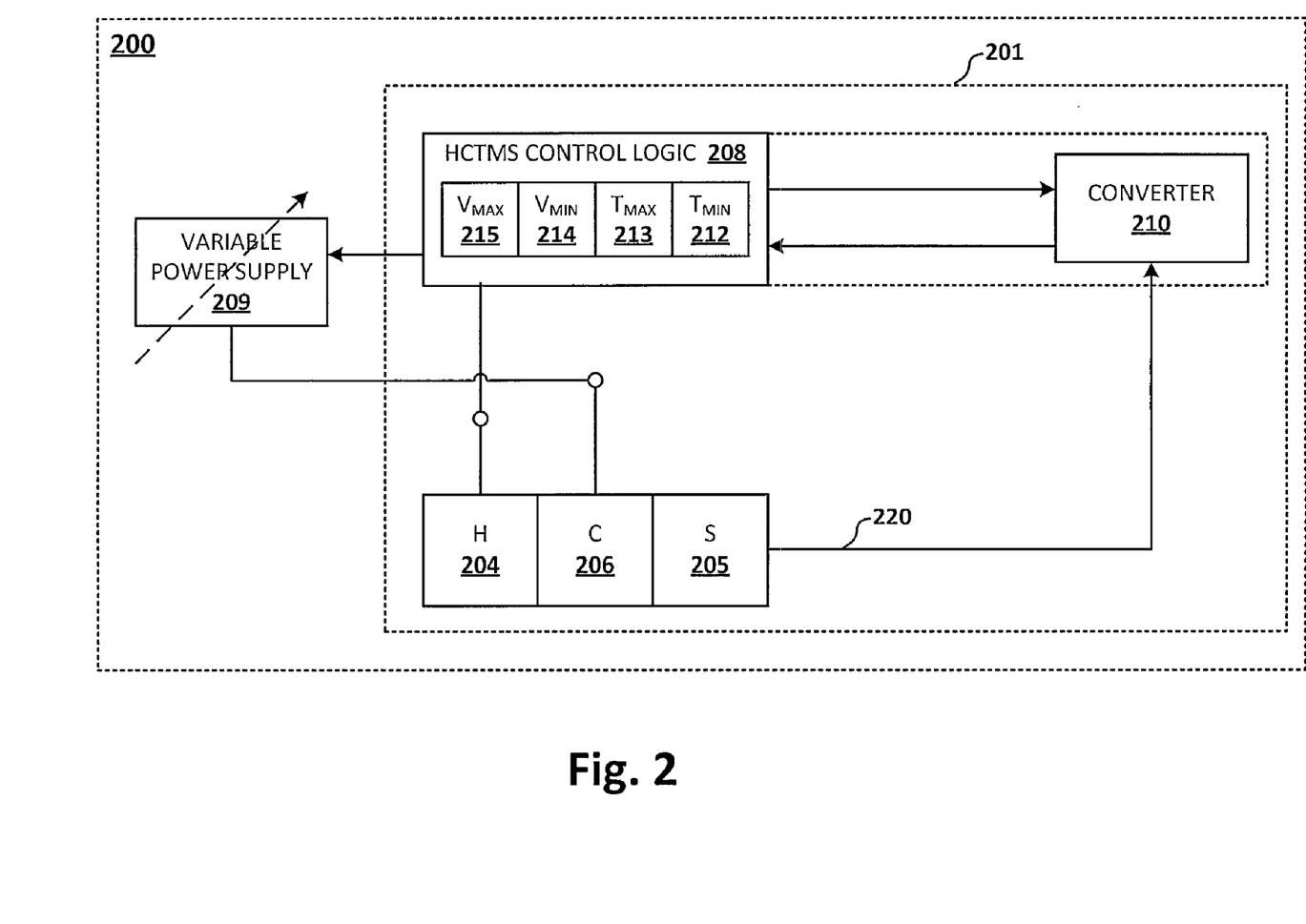
FIG. 2 illustrates the heat control and temperature monitoring system (HCTMS) of a high power device in a feedback system, according to an illustrative embodiment of the present invention.

FIG. 2 illustrates the heat control and temperature monitoring system (HCTMS) of a high power device with feedback, according to an illustrative embodiment of the present invention. System 200 comprises Temperature Control Subsystem (TCS) 201, which includes HCTMS control logic 208, heater (H) 204, component (C) 206 and thermal sensor (S) 205 (e.g., thermal diode). Heater (H) 204 is an ancillary heater that is connected to and controlled (turned on/off) by HCTMS control logic 208. HCTMS control logic 208 is also connected to variable power supply 209, which controls the level of voltage power applied to the devices/components within the system that generate/emit quiescent self heat.

According to the illustrative embodiment, HCTMS control logic 208 is also operationally coupled to voltage-to-temperature converter 210, which converts received electrical (current or voltage) output 220 from thermal sensor 205 into the corresponding measured temperature of component 206. Converter 210 then provides the temperature value to HCTMS 208, which compares the measured voltage against preset temperature thresholds, such as the minimum temperature threshold and the maximum temperature threshold of component 206. In one embodiment, converter 210 is provided as an internal logic within HCTMS control logic 208 (as indicated by the dashed lines incorporating converter 210 into HCTMS control logic 208). In another embodiment, converter 210 may be logic within sensor 205 itself, rather than a separate component. In yet another embodiment, no converter is utilized, and HCTMS control logic 208 performs the comparison using the voltage/current values (220) received from thermal sensor 205.

Thermal sensor 205 monitors/detects junction temperature of component 206 and provides an output 220 to converter 210, which output is indicative of the junction temperature. In one embodiment, thermal sensor 205 is a thermal diode and generates a voltage that is representative of the present temperature of component 206. The voltage value (or corresponding current) output 220 generated by thermal sensor 205 is fed into converter 210.

HCTMS control logic 208 is programmed with (or provided) a plurality of calibrated inputs, including the values of: (1) the minimum operating threshold temperature ($T_{Min}$) 212 (corresponding to the lowest operational temperature threshold for component 206); (2) the maximum operating temperature threshold ($T_{Max}$) 213 (corresponding to the maximum operational temperature of component 206); (3) the steady stage minimum voltage level for operating component 206 with minimal heat dissipation ($V_{Min}$) 214; and (4) the highest operational voltage level that should be applied across terminals of component 206 ($V_{Max}$) 215 (corresponding to the voltage at which maximum heat dissipation occurs from component 206 or surrounding devices).

The first two temperature values represent the operating temperature range of component 206. These values are utilized by HCTMS control logic 208 to cause component 206 to attain the operational temperature before initiating operation of component 206 and to maintain the temperature of component 206 within the operational range once component 206 becomes operational. The two voltage values represent the operational voltage range of component 206, with the first lower value, $V_{Min}$ (214) representing the desired voltage for steady state operation, of component 206. The higher voltage value, $V_{Max}$ (215) is utilized by HCTMS control logic 208 to provide enhanced pre-heating of component 206 to achieve the minimum operating temperature threshold before activation/operation of component 206.

When the voltage (or temperature) output 220 from sensor 205 indicates that the measured junction temperature of component 206 is below the minimum operating temperature of component 206, HCTMS control logic 208 triggers variable power supply 209 to increase the voltage being applied to component 206. HCTMS control logic 208 triggers an increase in the applied voltage up to $V_{Max}$ so as to effect an increased and/or faster heating of the junction temperature of component 206. Applying a larger voltage across component (or devices within or in vicinity of components) causes larger power dissipation due to quiescent leakage of component 206 (or devices), which leads to greater heat dissipation.

The variable power supply 209 may be triggered to increase the voltage across the component by any value up to $V_{Max}$, and actual determination of the amount of voltage increase may be performed by pre-analysis of the effects of voltage increase on the temperature increase around the component. The HCTMS control logic 208 may then be calibrated to provide just enough increase in voltage to effect the amount of pre-heating required/desired. In one embodiment, the calibration may be a dynamic function, based on the feedback from sensor 205 in response to measured increases in applied voltage. Thus, variable output 220 of sensor 215 is utilized to determine whether to continue (or initiate) pre-heating of the component by increasing the voltage provided by variable power supply 209. Output signal 220 indicates whether component 206 has attained the operational temperature and specifically what temperature levels have been attained.

Control logic 208 determines, based on the temperatures attained by component 206, whether to increase the operational voltage supplied to component 206, which voltage is provided by variable power supply 209. This determination may be based on factors which may include ambient conditions and the rate at which self heating effectively raises the temperature of component 206. For example, extremely low temperatures may dictate that a mid range operational voltage is attained before the variable voltage supply is decreased/restored to a standard/nominal operating voltage level. When the components have attained an operational temperature, system power is applied to all key components, and the variable power supply is reduced to $V_{Min}$. Subsequently, self heating is relied upon for maintaining an operational temperature for each key component, unless additional heating from heater 204 is required.

Figure 3A:
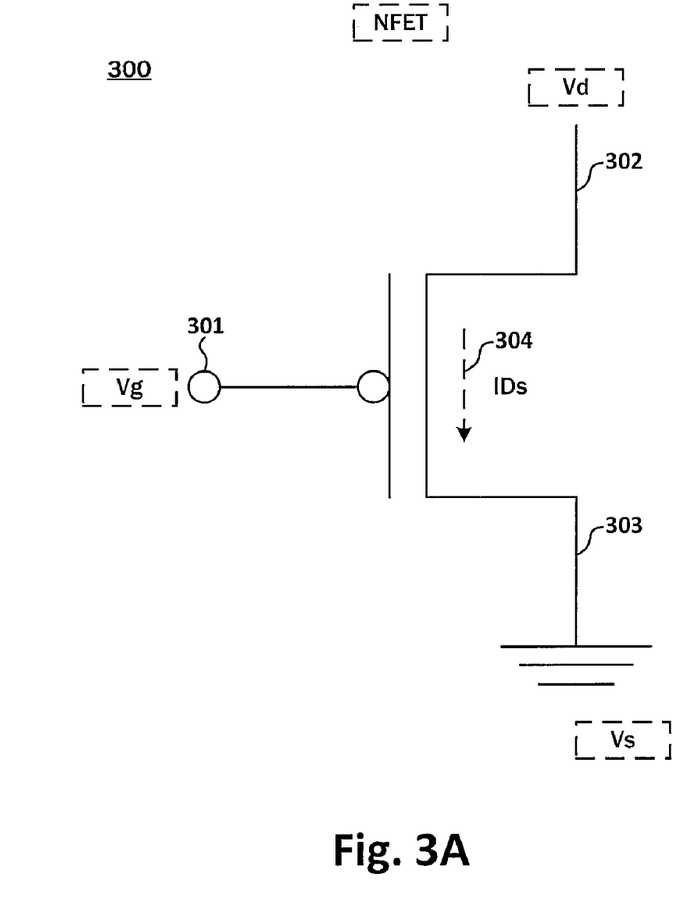
FIG. 3A depicts a negative field effect transistor (NFET) which illustrates the generation of leakage currents, according to an illustrative embodiment of the present invention.

FIG. 3A depicts a negative field effect transistor (NFET) which illustrates the generation of sub threshold leakage currents, according to an illustrative embodiment of the present invention. NFET 300 facilitates an explanation of the heating impact of leakage currents in high power devices (e.g., components 106), which employ NFETs and other semiconductor devices as integrated circuit (IC) building blocks. These ICs may comprise millions of semiconductor devices.

NFET 300 comprises gate 301, source 303 and drain 302. A corresponding gate voltage (Vg) may be applied/connected to gate 301. A source voltage (Vs) may be applied/connected to source 303, and a drain voltage (Vd) may be applied/connected to drain 302. When the voltage applied at the gate of NFET 300 is high, i.e., the voltage level representing a digital "1", NFET 300 is turned on and becomes operational. Alternatively, when the voltage applied at the gate of NFET 300 is low, i.e., the voltage level representing a "0", NFET 300 is turned off and becomes non-operational.

Because of small Metal Oxide Semiconductor Field Effect Transistor (MOSFET) geometries, high power devices are ideally designed to accept voltages at the gate, which voltages are small enough to allow the device to operate reliably. To maintain performance, the threshold voltage of the MOSFET is ideally small as well. As the threshold voltage is reduced, the transistor is incapable of being completely turned off, that is, the transistor operates in weak-inversion mode, with a sub-threshold leakage, or sub-threshold conduction, between source and drain. Thus, although NFET 300 may be turned off, a leakage current, for example, leakage current 304, still flows.

High power ASICs and microprocessors, even when non-functional, dissipate a significant amount of heat due to leakage paths inherent in the design. As microelectronic designs evolve, circuit geometries are reduced, leading to proportional increases in circuit density of ASIC and microprocessor designs. In addition, the reduced geometries and subsequent circuit densities result in shorter leakage paths in increasing numbers per unit of volume. Consequently, higher power densities are found within the devices, such as components 106 (FIG. 1), as the microelectronic designs continue to evolve. Furthermore, these high circuit density devices such as ASICs and microprocessors dissipate large amounts of heat due to the high density of leakage paths within the device. The leakage paths exist and are independent of the device's functionality or performance. The level or amount of leakage current is proportional to some extent (or may be roughly correlated to) the size of the voltage applied across the device while the device is in quiescent stage. Also, the amount of heat dissipation due to the leakage current is directly proportional to the amount of leakage current.

The heat generated by the leakage current effectively heats the device, i.e., quiescent self heating takes place. The high power dissipation due to leakage path losses is utilized as a heat source of opportunity, and, as a heat source, is applied for the purpose of self pre-heating the device. This quiescent self pre-heating feature mitigates or reduces the need for an ancillary pre-heat source which would otherwise be required to elevate the junction temperatures within the device to a temperature which places the device within a reliable operating temperature range.

Figure 3B:
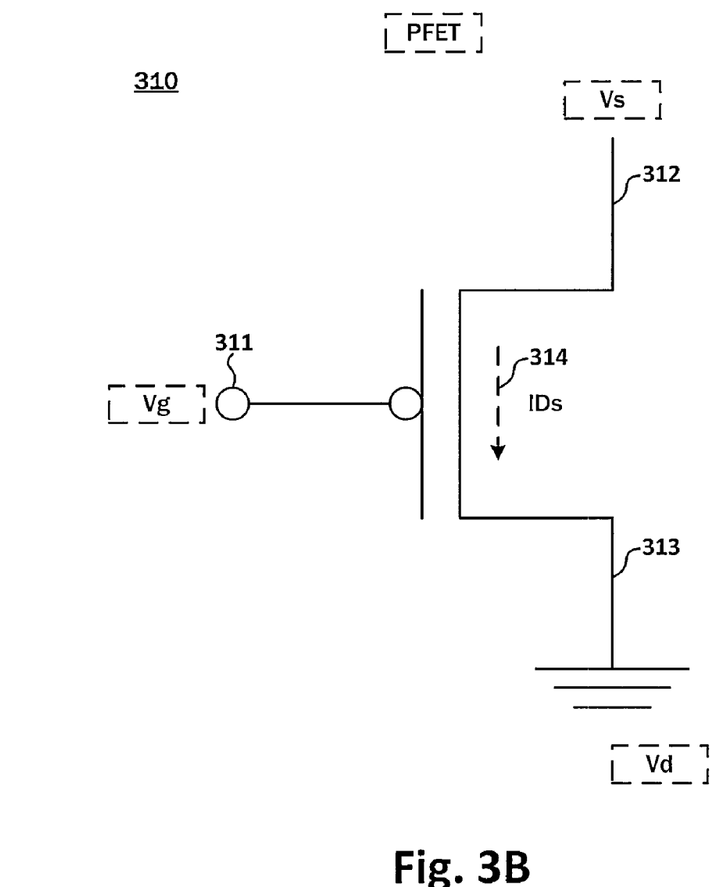
FIG. 3B depicts a positive field effect transistor (PFET) which illustrates the generation of leakage currents, according to an illustrative embodiment of the present invention.

FIG. 3B depicts a positive field effect transistor (PFET) which illustrates the generation of sub threshold leakage currents, according to an illustrative embodiment of the present invention. PFET 310 comprises gate 311, source 312 and drain 313. A corresponding gate voltage (Vg) may be applied/connected to gate 311. A source voltage (Vs) may be applied/connected to source 312, and a drain voltage (Vd) may be applied/connected to drain 313. One of these voltages are higher than the other leading to a voltage drop across the device and subsequent current flow through the device when the device is "on" or a leakage current flow while the device is in quiescent stage. When the voltage applied at the gate of PFET 310 is low, i.e., the voltage level representing a digital "0", PFET 310 is turned on. Alternatively, when the voltage applied at the gate of PFET 310 is high, i.e., the voltage level representing a "1", PFET 310 is turned off. The digital high voltage level represents a voltage which is greater than the threshold voltage below which PFET 310 becomes operational. Thus, unlike NFET 300, PFET 310 is turned off when a digital 1 is applied to source 312. However, similar to NFET 300, leakage current 314 flows in PFET 310 when the device is turned off.

Microprocessors and large scale application specific integrated circuits (ASICs) comprise millions of semiconductor devices which, due to their usage in any given design are not all in an off state when power is applied and the device is quiescent or idle. Leakage current is increased significantly due to the contribution of those cases where the semiconductor devices are in an on state but nor operational (i.e., when idle), lending to the high increase in power dissipation with increasing circuit packaging densities.

Figure 4:
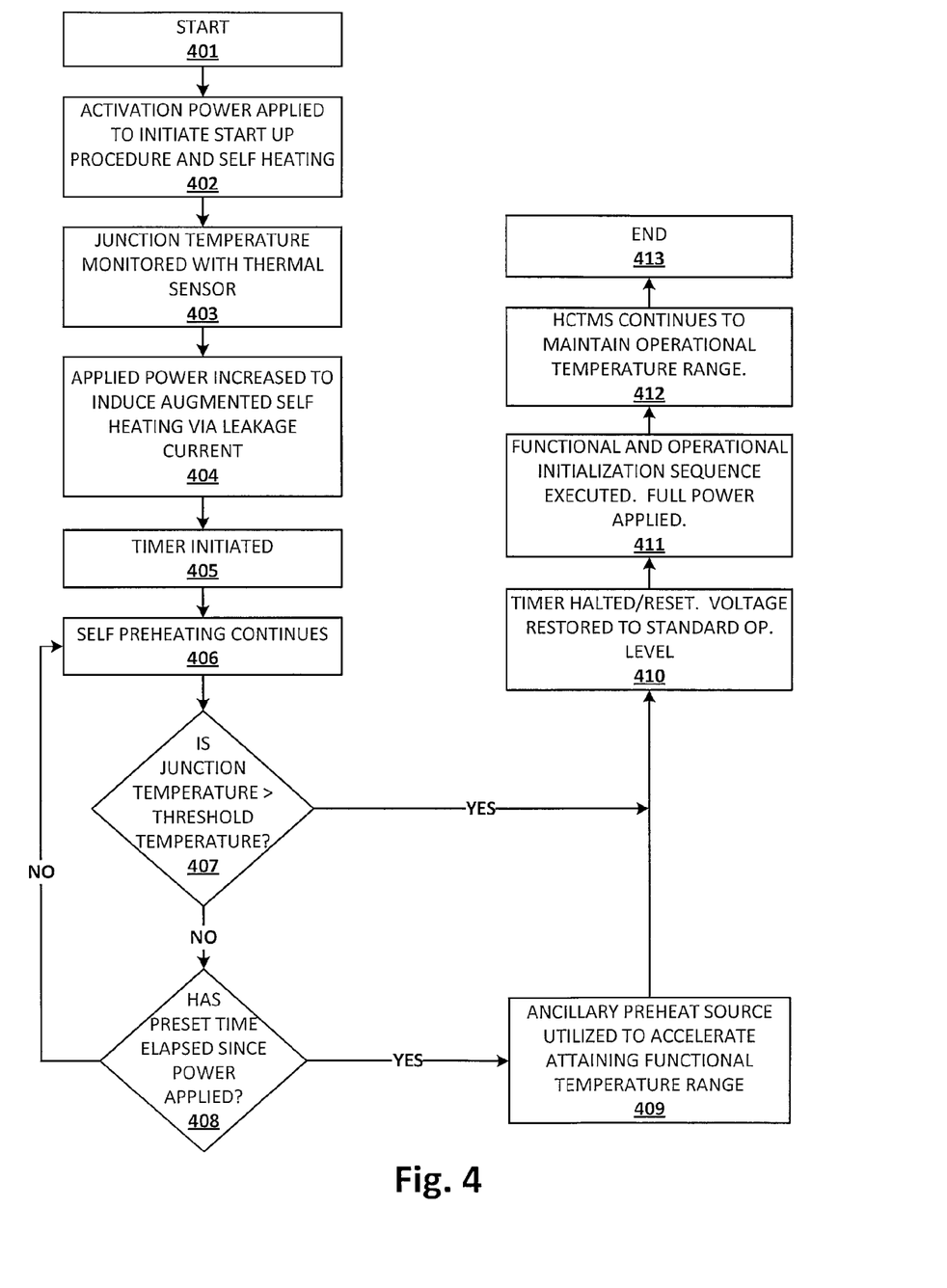
FIG. 4 illustrates the process of applying increased/maximum operating voltages to augment a quiescent self heating mechanism (without an ancillary heat source) to accelerate the attainment of temperature levels within the operating temperature range of high power devices, according to an illustrative embodiment of the present invention.

FIG. 4 illustrates the process of increasing operating voltage to augment a quiescent self heating mechanism (without an ancillary heat source) for the purpose of attaining temperature levels within the operating temperature range, according to an illustrative embodiment of the present invention. The process begins at block 401, and proceeds to block 402, at which an activation procedure is initiated for some of the device's core components. The activation procedure is also responsible for initiating self heating via quiescent leakage current. In one embodiment, the activation procedure may involve activating a system start up button, for example. Alternatively, a pre-programmed facility may initiate the device's activation procedure.

At block 403, the junction temperature corresponding to the high power component(s) 106 is monitored using an embedded (or attached) thermal sensor (e.g. thermal sensor 105 of FIG. 1). In the illustrative embodiment, where the embedded (or adjacent) thermal sensor of the component (or a sensor embedded in an attached heat-sink) is a thermal diode, the diode produces a forward bias voltage that varies linearly with temperature. The diode is independent, and does not require operation of the system to provide this implicit temperature measurement. The forward biased diode voltage that represents the lowest operating temperature of the component(s) is determined through characterization and/or calibration during or prior to a system design and/or final test. A comparator (threshold detector) switches its output to indicate when the temperature of the high power component(s) attains or goes above the lowest operating temperature of the component(s). As described above, the comparator may be internal logic of the HCTMS control logic.

At block 404, the applied power supply voltage is dynamically increased to produce over-voltage (or over-current) and induce augmented self heating via leakage currents. The application of over-voltage and over-current may be used to perform parametric drift compensation and also serve as a self heat source of opportunity to elevate and accelerate the rise in temperature when required to establish a reliable device operating temperature. The self heating process may also be used to expand the usable operating range of microelectronic devices. An expanded operating temperature range is achieved by virtue of constructive compensation for out of tolerance parametric (voltage and/or current) shifts with decreasing temperature which would otherwise degrade reliable operation in a typical and traditional application environment. The temperature increase realized in this manner is due to the self heating of the device itself, induced and enhanced by the application of an increase in power supply voltage, and thus input power.

The applied voltage may remain at a higher than normal/standard value for as long as conditions for sustained and reliable functionality and performance are maintained, and/or if the applied voltage is required to maintain junction temperatures within prescribed or operational limits or otherwise dictated to ensure reliable operation. The process of induced and augmented self heating proportionally increases the quiescent power dissipation, and thus junction temperatures within the device, to temperatures above that which would occur if operated with only prescribed nominal/standard operating voltages and currents applied.

Power dissipation increases approximately by the square of the increase in applied operating voltage, and as long as safe operating limits are defined and maintained, the process of increasing the applied voltage serves as a heat source of opportunity. The resulting quiescent self heating proportionally increases the temperature of the device and favorably compensates the internal operating junction temperatures when very low temperature operation is desired.

Returning to the figure, at block 405, a timer is initiated. The timer is used to track whether sufficient time, i.e., a preset amount of time, has elapsed in order to benefit from the (temperature elevating) impact of the quiescent self heating process. As leakage currents flow, quiescent self pre-heating begins/continues to elevate the junction temperature of the component, as shown at block 406. The temperature control logic then determines, at block 407, whether the junction temperature measured by the thermal sensor is, at least, equal to the lowest operational threshold temperature of the component. If the junction temperature is less than the lowest operational threshold temperature of the device, the process moves to block 408, at which, the temperature control system determines whether the preset time allowed for preheating the component to an operational temperature (by applying an increased voltage) has elapsed. If at block 408 the preset time has elapsed, the component is pre-heated utilizing an ancillary heat source (e.g., heater 104 in FIG. 1) in order to attain the lowest operational temperature, as shown at block 409. If at block 408 the preset time has not elapsed, quiescent self heating continues without the addition of an ancillary heat source, as shown at block 406.

Returning to block 407, if the junction temperature is greater than or equal to the lowest operational threshold temperature of the device, the timer is halted and the operating power supply voltage is restored to a standard operating level, as shown at block 410. Full system power is then applied, accompanied by an initialization procedure which concludes with the device (or component) being operational, as shown at block 411.

In one embodiment, previous results from a particular design and/or system test focused on power dissipation may be utilized to determine the likelihood of success of quiescent self heating to elevate the temperature of a specified device/component in certain ambient conditions. An expected degree/amount of quiescent self heating may be derived from empirical/test data, or from the results of product characterization performed by the device manufacturer. The quiescent self heating impact may also be time/age-correlated to the device. Extreme ambient conditions may trigger the immediate activation of an ancillary heat source instead of waiting for the quiescent self heating process to elevate the temperatures over a substantially large range. Thus, results from previous tests may be utilized by HCTMS 102 to make appropriate and timely decisions and trigger specific actions.

Returning to FIG. 4, once the component is operational, the self heating due to the high power dissipation of components within the system continues without an ancillary heat source to maintain the temperature of the component within the operational temperature limits, as shown at block 412. The component's temperature is continuously monitored by the thermal sensor and the self heating by the components enables the component's temperature to remain above the operational threshold while the component remains operational. The power supply voltage may be increased slightly or to the limit of maximum safe operating voltage, and in extreme cases, an ancillary heater may be activated when self heating of the device under normal operating conditions is insufficient to maintain the device above the lowest operating temperature. The process ends at block 413.

Thus, with the above embodiments, a system is provided having at least one component that operates within a temperature range having a lowest operating temperature. The system also has a temperature control subsystem having: (a) logic for detecting when a temperature of the at least one component is below the lowest operating temperature; (b) logic for triggering dissipation of heat by applying higher levels of activation power to devices within the system, which devices are prone to generate heat dissipation via quiescent leakage current. The higher levels of activation power is applied by increasing the voltage above the normal operating voltage prior to applying system power to, and initiating operation of, the at least one component. The higher levels of activation power then enables the at least one component to be pre-heated to at or above the lowest operating temperature via the heat dissipation attributable to the quiescent leakage current; (c) logic for increasing operating voltages to a maximum operating level to induce augmented degrees of self heating; (d) logic for enabling an ancillary heater when self heating of the device while operating under normal operating conditions is insufficient to maintain the device above the lowest operating temperature; and (e) logic for enabling general system power to be applied to the at least one component and subsequent operation of the at least one component only when the temperature measured at the at least one component is at or above the lowest operating temperature.

In one embodiment, the devices to which activation power is applied may comprise one or more transistors, which are initially in the off state prior to application of general system power and which receives the activation power across terminals and yields a quiescent leakage current as a functional characteristic of the device and the applied voltage level.

More specifically, the logic for detecting comprises one or more thermal sensors that detect the temperature of the at least one component, wherein the one or more thermal sensors are calibrated to detect and generate an output indicative of the temperature of the component, including temperatures below the lowest operational temperature. Also, depending on the embodiment being implemented, the one or more thermal sensors may include at least one of: (a) one or more thermal diodes which produces a forward bias voltage which varies linearly with temperature, wherein the diode is positioned proximate to the component; and (b) one or more thermistors; (c) one or more bimetallic thermocouples; and one or more thermostats.

Additionally, the logic for triggering dissipation of heat further comprises at least one heater that is selectively activated to generate heat for increasing the temperature of the at least one component when heat dissipation from leakage current and self heating is not sufficient to raise or maintain a measured temperature above the lowest operating temperature. The device also comprises logic for activating the heater when heat generated by leakage current heat dissipation does not elevate the temperature of the at least one component above the lowest operational temperature within a preset time period following a system start-up procedure that applies power to the devices without turning the devices on. Then, when the detected temperature is at least equal to the lowest operational temperature threshold, the logic deactivates said heater to allow self heating by heat dissipation of operating components and devices to maintain the operational temperature. However, when the device is operational and self heating is unable to maintain an operational temperature, the logic automatically activates the heater to assist the self heating process in maintaining the operational temperature.

In one embodiment, the temperature control subsystem further comprises: logic for evaluating a temperature against pre-set criteria; and logic for triggering activation of a selected one of multiple heating modes from among: (a) self heating using higher levels of applied power across devices prone to quiescent current leakage, without use of an ancillary heater, wherein heat dissipation from the devices and components is used as a singular heating source during system operation, without activating the ancillary heater to maintain the operating temperature within said operating temperature range; (b) self heating along with use of the ancillary heater when the self heating is not sufficient to maintain the temperature of the at least one component above the lowest operating temperature; and (c) combined heating via self heating and use of the ancillary heater to enable initialization of the at least one component, maintain operation of the at least one component once initialized, and extension of the operating temperature range of the at least one component below a normal lowest ambient temperature surrounding the system.

In another embodiment, when greater control of the induced and augmented self heat-generation process is required, an increase of the operating voltage may be executed in one of the following ways: (1) applying a fixed preset increase of the operating voltage level; and (2) adaptively adjusting the applied operating voltage while the junction temperatures within the device are continuously monitored.

Finally, in one embodiment, a method is provided for pre-heating a device with one or more components. The method comprises: initiating a timer when increased system power is applied to trigger pre-heating via increased quiescent leakage current; determining an elapsed time interval following initiation of the timer; monitoring an impact of heat dissipation caused by the increased quiescent leakage current on an increase in detected temperature within a pre-defined interval; and when the impact is less than a pre-set level of increased temperature of the device (or component) required within the pre-defined interval, activating an embedded heater to enhance the rate of temperature increase until the detected temperature is at or above the operational temperature.

While the invention has been particularly shown and described with reference to the illustrated embodiments, it will be understood by those skilled in the art that various changes in form and detail may be made therein without departing from the spirit and scope of the invention. For example, other mechanisms for detecting ambient heat other than the use of thermal diodes may be provided in alternate embodiments.

What is claimed is:

1. A device comprising:
   a variable power supply;
   at least one component from a plurality of components that operates within a temperature range that includes a lowest operating temperature threshold; and
   a temperature control subsystem for attaining a temperature of the at least one component within the temperature range, the temperature control subsystem containing logic that:
      monitors the temperature and a temperature change of the at least one component;
      detects when the temperature of the at least one component is below the lowest operating temperature threshold; and
      in response to detecting the temperature of the at least one component, prior to operation of the at least one component, is below the lowest operating temperature threshold, automatically increases a level of voltage applied across the at least one component by the variable power supply to initiate an advanced preheating of the at least one component to within the temperature range, wherein the at least one component self generates an amount of heat proportional to an amount of quiescent leakage current by the at least one component, and wherein increasing of the level of voltage applied across the at least one component increases the quiescent leakage current.

2. The device of claim 1, wherein the temperature control subsystem comprises:
   one or more thermal sensors that detect the temperature of the at least one component; and
   at least one heater that is selectively activated to generate an additional amount of heat to further increase the temperature of the at least one component.

3. The device of claim 1, wherein the control subsystem comprises logic that:
   in response to the temperature of the at least one component reaching the lowest operating temperature threshold, subsequently decreases the level of voltage applied across the at least one component by the variable power supply to an optimal level for operation of the at least one component.

4. The device of claim 2, wherein:
   the temperature control subsystem further comprises logic that:
      in response to the temperature of the at least one component being less than the lowest operating temperature threshold and the rate of heat generated being below a preset threshold rate, applies power to activate the at least one heater; and
      in response to the temperature of the at least one component being at or above the lowest operating temperature threshold, removes the power applied to the at least one heater; and
   the variable power supply supplies an optimal operating power to the at least one component in response to the one or more thermal sensors detecting the temperature of the at least one component is at least equal to the lowest operating temperature threshold.

5. The device of claim 1, further comprising:
   a cooling mechanism including a heat sink;
   wherein said temperature control subsystem further comprises logic that:
      detects when the at least one component becomes operational; and
      in response to the at least one component becoming operational:
         regulates the temperature of the at least one component using a combination of the heat sink and the self heating generated by the at least one component, wherein the self heating is utilized to maintain the temperature of the at least one component at least equal to or above the lowest operating temperature threshold;

detects when the temperature of the at least one component falls below the lowest operating temperature threshold, wherein falling of the temperature of the at least one component below the lowest operating temperature threshold indicates that the self heating generated by the at least one component is not sufficient to maintain the temperature above the lowest operating temperature threshold; and in response to detecting the temperature of the at least one component has fallen below the lowest operating temperature threshold, activates the at least one heater to generate heat independent of the self heating to assist in maintaining the temperature at or above the lowest operating temperature threshold.

6. The device of claim 4, the temperature control subsystem further comprises logic that:

triggers activation of the at least one heater to generate heat in conjunction with the self heating generated by the at least one component temperature range of the device, wherein the combination of heat generated from the at least one heater and the self heating generated by the at least one component extends a lower limit of the temperature range of the device.

7. The device of claim 2, wherein the thermal sensor is a thermal diode which produces a forward bias voltage which correlates with the temperature of the at least one component;

the temperature control subsystem further comprises logic that determines when the forward bias voltage correlates the temperature of the at least one component to a temperature level below the lowest operational temperature threshold; and the at least one heater is embedded in a heat sink and wherein the thermal sensor is positioned proximate to the at least one component and the heat sink.

8. The device of claim 1, wherein the temperature of the at least one component corresponds to one or more junction temperatures within the at least one component.

9. The device of claim 2, wherein the one or more thermal sensors are calibrated to detect and generate an electrical output that is indicative of the temperature of the component including temperatures below the lowest operating temperature threshold.

10. A system comprising:

a variable power supply;

at least one component from a plurality of components that operates within a temperature range having a lowest operating temperature; and a temperature control subsystem for attaining a temperature of the at least one component within the temperature range, the temperature control subsystem having logic that:

monitors the temperature and a temperature change of the at least one component;

detects when a temperature of the at least one component is below the lowest operating temperature;

prior to operation of the at least one component:

triggers self heat generation by the at least one component by applying an activation power supply voltage to the at least one component, wherein the at least one component is self generates an amount of heat proportional to an amount of quiescent leakage current by the at least one component; and in response to detecting the temperature of the at least one component is below the lowest operating temperature threshold, automatically increases a level of voltage applied across the at least one component by the variable power supply, to initiate an advanced preheating of the at least one component to at or above the lowest operating temperature, wherein the increasing of the voltage applied across the at least one component increases the quiescent leakage current; and enables operation of the at least one component only in response to the temperature of the at least one component being at or above the lowest operating temperature.

11. The system of claim 10, wherein the system further comprises:

one or more thermal sensors that detect the temperature of the at least one component, wherein the one or more thermal sensors do not require power be applied to the at least one component to detect the temperature of the at least one component.

12. The system of claim 10, wherein the temperature control subsystem logic that triggers self heat generation by the at least one component further comprises in response to the at least one component becoming operational, logic that:

in response to the temperature of the at least one component being below the lowest operating temperature, increases the voltage across the at least one component to one of a maximum operating level and a preset offset below the maximum operating level.

13. The system of claim 11, wherein the one or more thermal sensors comprises at least one of:

one or more thermal diodes, wherein the one or more thermal diodes produce a forward bias voltage that varies linearly with temperature, and wherein the one or more thermal diodes are positioned proximate to the at least one component;

one or more thermistors;

one or more bimetallic thermocouples; and one or more thermostats.

14. The system of claim 10, wherein the temperature control subsystem further comprises logic that:

evaluates the temperature of the at least one component against pre-set criteria;

in response to determining the self heat generated by the quiescent leakage current is sufficient to maintain the temperature of at least one component within the temperature range, triggering activation of a self heating mode, wherein the self heating mode uses only the self heat generated by the quiescent leakage current of the at least one component, without activation or use of an ancillary heater, maintain the temperature of the at least one component within the temperature range; and in response to determining the self heat generated by the quiescent leakage current is not sufficient to maintain the temperature of at least one component within the temperature range, triggering activation of a self heating and ancillary heater mode, wherein the self heating and ancillary heater mode uses the self heat generated by the quiescent leakage current of the at least one component and, after a preset amount of time has elapsed where the temperature of at least one component is not within the temperature range, uses one or more ancillary heaters to heat the temperature of the at least one component until the lowest operating temperature is attained.

15. The system of claim 10, wherein the system comprises one or more transistors which are initially in an off state prior to application of general system power, wherein the one or more transistors enable operation of the at least one component and receive the activation power, and wherein the one or more transistors yield a leakage current in response to having an applied voltage.

16. The system of claim 11, wherein the one or more thermal sensors are calibrated to detect and generate an electrical output that is indicative of the temperature of the component including temperatures below the lowest operating temperature threshold.

17. The system of claim 14, the temperature control subsystem further comprising logic that:

in response to detecting an extreme ambient condition, triggers a combined heating mode, wherein the combined heating mode uses the self heat generated by the quiescent leakage current of the at least one component and immediately activates the one or more ancillary heaters to enable extension of a temperature range of the system below a normal lowest ambient temperature of the system.

18. The system of claim 10, the temperature control subsystem further comprising logic that:

in response to the temperature of the at least one component being above the lowest operating temperature, restores the power supply voltage to a standard operating level by decreasing the level of voltage applied across the at least one component by the variable power supply.

19. The system of claim 10, wherein the temperature of the at least one component corresponds to one or more junction temperatures within the at least one component.

* * * * *